United States Patent [19]

Sechi

[11] 4,189,682
[45] Feb. 19, 1980

[54] MICROWAVE FET POWER CIRCUIT

[75] Inventor: Franco N. Sechi, Lawrenceville, N.J.

[73] Assignee: RCA Corporation, New York, N.Y.

[21] Appl. No.: 927,626

[22] Filed: Jul. 24, 1978

[51] Int. Cl.² .................... H03F 3/193; H03F 3/195; H03B 5/12

[52] U.S. Cl. .................. 330/277; 330/286; 330/307; 331/108 C; 331/117 R

[58] Field of Search ............... 330/277, 286, 289, 300, 330/307; 331/70, 108 C, 117 R

[56] References Cited

U.S. PATENT DOCUMENTS

| | | | |
|---|---|---|---|
| 3,716,730 | 2/1973 | Cerny | 330/277 X |
| 3,965,437 | 6/1976 | Kim | 330/289 X |
| 4,135,168 | 1/1979 | Wade | 331/108 R |

OTHER PUBLICATIONS

Wade, "X-Band Reverse Channel GaAs FET Power VCO", Microwave Journal, vol. 21, No. 4, Apr. 1978, p. 92.

Primary Examiner—James B. Mullins
Attorney, Agent, or Firm—Samuel Cohen; Joseph D. Lazar; Raymond E. Smiley

[57] ABSTRACT

A field effect transistor (FET) is comprised of a plurality of unit transistors having a common gallium arsenide substrate with an N-type active region. Each unit transistor is comprised of a unit gate, a unit drain and a unit source. The FET is mounted in a flip-chip carrier that connects all of the unit sources together to form a first electrode of the FET. Additionally, the first electrode is connected to ground by the carrier. All of the unit drains are connected together on the substrate to form a second electrode of the FET. The FET is reverse biased to cause a current to flow from the first electrode to the second electrode, whereby the first and second electrodes are a drain and a source, respectively, of the FET.

1 Claim, 4 Drawing Figures

MICROWAVE FET POWER CIRCUIT

The Government has rights to this invention pursuant to Contract No. F33615-76-C-1144 awarded by the Department of the Air Force.

CROSS REFERENCE TO COPENDING APPLICATIONS

Of interest are the following commonly assigned pending U.S. patent applications: U.S. patent application Ser. No. 927,624, filed on even date herewith, entitled, "Microwave FET Power Oscillator" by Raymond L. Camisa; and U.S. patent application Ser. No. 927,625, filed on even date herewith, entitled, "Microwave FET Power Oscillator" by Franco N. Sechi and Raymond L. Camisa.

BACKGROUND OF THE INVENTION

Field of Invention

This invention relates to circuits that operate at microwave frequencies particularly in the gigahertz range and more particularly to a field effect transistor mounted in a flip-chip carrier.

An oscillatory tendency of a field effect transistor (FET) is typically expressed in terms of Rollett's stability factor (k). See J. M. Rollet "Stability and Power-Gain Invariants of Linear Two-Ports", IRE Transactions on Circuit Theory, Vol. CT 9, pp. 29-32; March, 1962. When the factor is greater than unity, the FET is unconditionally stable.

When the stability factor is less than unity, the FET is potentially unstable. Because of this potential instability, a combination of a passive load impedance and a passive input impedance of the FET can be selected to induce oscillation. When the FET tends to oscillate at microwave frequencies, it can be used in two important types of microwave circuits: an oscillator and a reflection amplifier.

In both types of circuits, the FET inherently dissipates power in direct relation to power delivered to a load. Hence, the power delivered by the amplifier, for example, is limited by the amount of power that the FET can safely dissipate.

The FET typically has a gallium arsenide substrate with an N-type active region. As known to those skilled in the art, gallium arsenide has a high thermal resistance compared with the thermal resistance of metal used for a heat sink. Because of the high thermal resistance, it is difficult to conduct heat through the substrate to a heat sink. Therefore, the thermal resistance of the substrate may limit the power that the FET can safely dissipate.

Increased amounts of heat are conducted from the substrate by either making the substrate as thin as practical and plating it with metal or providing an increased spatial separation between elements of the FET. However, either plating the thin substrate or increasing the spatial separation of the elements increases the complexity of construction of the FET.

Alternatively, the heat may be conducted from the surface of the substrate where the heat is generated by mounting the FET in a type of heat sink known as a flip-chip carrier. The flip-chip carrier is referred to and shown in the article, "Thermal Resistance of GaAs Power FETs" by H. C. Huang, F. N. Sechi and L. S. Napoli in the Proceedings of the Sixth Biennial Cornell Electrical Enginerring Conference (1977). To understand the mounting in the carrier, it should be understood that the FET is comprised of a plurality of unit transistors with the substrate common to all of the unit transistors.

An exemplary unit transistor includes three elements, one of which is a thin metal deposition, known as a unit gate, that forms a Schottky barrier junction with the substrate. The other two elements are each a thin metal deposition in ohmic contact with the substrate. The other two elements serve as a unit drain and a unit source, respectively.

The total area on the substrate utilized by the unit sources is greater than the area utilized by either the unit gates or the unit drains. Therefore, the heat is most effectively conducted from the substrate when it is connected to the carrier through the unit sources. Moreover, this type of connection to the carrier does not include a wire lead, since the lead may introduce an undesired inductance.

The unit sources are easily connected to the carrier when they have a layer of metal plating thereby providing plated unit sources with surfaces that have a displacement from the substrate greater than the displacements of the surfaces of the unit gates and the unit drains. The FET is mounted with the surfaces of the plated unit sources in contact with a flat surface of the carrier. Because the surfaces of the plated unit sources has a greater displacement from the substrate than the surfaces of the unit gates and unit drains, the flat surface does not make contact with either the unit gates or the unit drains. The carrier is typically connected to a ground plane so that all of the unit sources form a grounded source electrode of the FET.

Usually, all of the unit drains are connected together by metal deposited on the substrate. Additionally, all of the unit gates are connected together by metal deposited on the substrate. However, the unit sources are not connected together by a metal deposition; they are only connected together through the carrier. When the substrate has an N-type active region, the unit gates and unit drains are biased negative and positive, respectively, relative to ground, to cause a bias current to flow from the unit drains to the unit sources. The unit gates, unit drains and unit sources are collectively referred to as a gate electrode, a drain electrode and a source electrode, respectively.

When the FET is mounted in the carrier, it is particularly suited for use in a common source circuit configuration because the unit sources form the grounded electrode. However, in the common source configuration, the FET usually has a stability factor greater than unity.

From the description given hereinbefore, it should be appreciated that the FET is not well suited for use in either reflection amplifiers or oscillators because the FET mounted in the carrier has a stability factor greater than unity. Heretofore, easily constructed power oscillators and reflection power amplifiers that utilize a field effect transistor mounted in a flip-chip carrier have been unknown in the art.

SUMMARY OF THE INVENTION

According to the present invention, a field effect transistor has unit sources and unit drains in ohmic contact with a semiconductor substrate, the unit drains being electrically connected together on the substrate. The transistor is mounted with the unit sources connected to ground through a heat sink. Bias voltages are applied to the transistor to cause the unit sources to function as the drain electrode of the transistor and the unit drains to function as the source electrode of the transistor.

DETAILED DESCRIPTION

Figure 1:
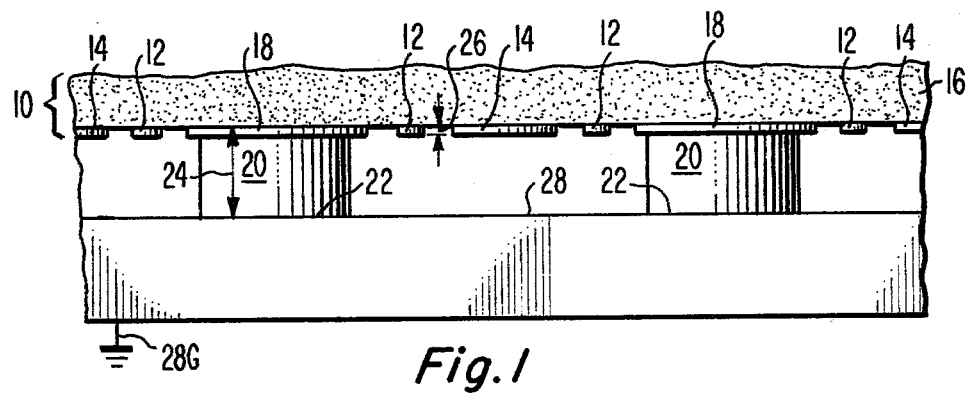
FIG. 1 is a portion of a section, taken parallel to a front elevation, of a field effect transistor connected to a heat sink.

As shown in FIG. 1, a conventional power FET 10 has a plurality of unit gates 12 and a plurality of unit drains 14 carried on a substrate 16. Unit gates 12 each form a Schottky barrier junction with substrate 16. Additionally, unit gates 12 are connected to each other by a metal deposition (not shown) on substrate 16.

Unlike unit gates 12, unit drains 14 are in ohmic contact with substrate 16. However, similar to unit gates 12, unit drains 14 are connected together by a metal deposition (not shown) on substrate 16.

Substrate 16 additionally carries a plurality of unit sources 18. Similar to unit drains 14, unit sources 18 are in ohmic contact with substrate 16. Unit sources 18 are all plated with gold to form posts 20 that have surfaces 22 with a displacement 24 from substrate 16. The distal surfaces of both unit gates 12 and unit drains 14 have a displacement 26 from substrate 16. Displacement 24 is much larger than displacement 26.

Surfaces 22 are maintained in an abutting relationship with a metallic heat sink 28 connected to a ground 28G whereby substrate 16 is connected to heat sink 28 through unit sources 18 and posts 20. Since displacement 24 is larger than displacement 26, unit gates 12 and unit drains 14 do not contact heat sink 28.

Figure 2:
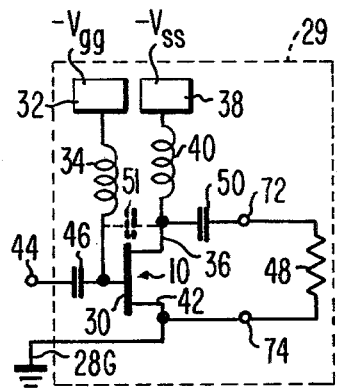
FIG. 2 is a schematic diagram of a circuit in accordance with the preferred embodiment of the present invention wherein the transistor of FIG. 1 is reversed biased.

As shown in FIG. 2, in a circuit 29, gate electrode 30 of transistor 10 is connected to a gate power supply $(-V_{gg})$ 32 through an RF choke 34. Choke 34 has a high impedance at all frequencies in the radio frequency spectrum whereby a signal in the radio frequency spectrum applied to gate electrode 30 is not absorbed by power supply 32.

Similarly, an electrode 36 of FET 10 is connected to a power supply $(-V_{ss})$ 38 through an RF choke 40, which is similar to RF choke 18. Additionally, an electrode 42 of FET 10 is connected to ground 28G.

Circuit 29 has an input port 44 connected to gate 30 through a blocking capacitor 46. Capacitor 46 has a low impedance at all frequencies in the radio frequency spectrum whereby a radio frequency signal applied at port 44 is provided to gate 30.

Electrode 36 is connected to one end of an impedance 48 through a blocking capacitor 50 (similar to capacitor 46). The other end of impedance 48 is connected to ground 28G.

According to the present invention, electrode 36 is connected to unit drains 14 (FIG. 1). Electrode 42 is connected to unit sources 18 and to ground 28G via heat sink 28. Since power supplies 32 and 38 respectively bias electrodes 30 and 36 negatively and substrate 16 has an N-type active region, FET 10 is reverse biased, thereby causing a current to flow from electrode 42 to electrode 36 through FET 10. Moreover, the current is modulated in response to a signal voltage from gate 30 to electrode 42. Since substrate 16 has the N-type active region, electrodes 36 and 42 serve as the source and drain, respectively, of FET 10.

It should be understood that the biasing of FET 10 causes the interelectrode capacitance 51 between gate electrode 30 and electrode 36 (source) to be higher than the other interelectrode capacitances of FET 10. Accordingly, the stability factor (k) of FET 10 becomes less than unity.

A sample field effect transistor of the type described hereinbefore, biased in a manner similar to the biasing of FET 10, was tested on a network analyzer to determine its stability factor (k). The stability factor (k) of the sample transistor as a function of frequency is tabulated in Table I:

TABLE I

| Frequency (Megahertz) | Stability Factor (k) |
|---|---|
| 4000.0 | .34 |
| 5000.0 | .37 |
| 6000.0 | .44 |
| 7000.0 | .61 |
| 8000.0 | .53 |
| 9000.0 | .53 |
| 10000.0 | .61 |
| 11000.0 | .72 |
| 12000.0 | .71 |

Since the stability factor is less than unity for all of the frequencies included in Table I, FET 10 is potentially unstable over the range of frequencies of Table I, useful therefore as a broadband oscillator.

Figure 3:
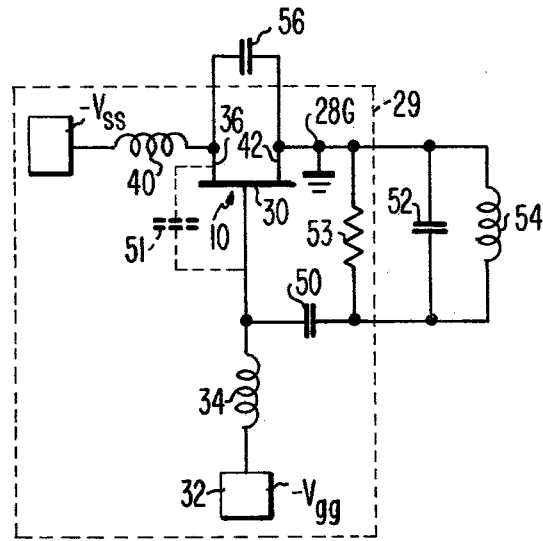
FIG. 3 is a schematic diagram of an oscillator that includes the circuit of FIG. 2.

As shown in FIG. 3, circuit 29 is used in a power oscillator that delivers on the order of one watt of power to a load. Circuit 29 includes a capacitor 52 and an inductor 54 that are connected in parallel with impedance 53 to form a parallel resonant circuit that resonates at a desired frequency of oscillation. Since capacitor 52 and inductor 54 are a parallel resonant circuit, the impedance from gate electrode 30 to electrode 42 (gate to drain impedance) substantially equals impedance 53 at the desired frequency. At other frequencies, the gate to drain impedance is of a reduced value since the impedance of the parallel resonant circuit is of a reduced value.

The operation of the power oscillator is predicated upon a voltage divider providing a source signal voltage $(V_S)$ between electrode 36 (source) and gate electrode 30. The source signal voltage $(V_S)$ is derived from a drain signal voltage $(V_D)$ between electrode 42 (drain) and gate electrode 30. The voltage divider is formed by a capacitor 56 connected to electrodes 36 and 42 and interelectrode capacitance 51, caused by the reversed biasing of FET 10 described hereinbefore. The output of the voltage divider is provided from electrode 36 (source) to gate electrode 30 in accordance with a voltage divider relationship which is given as:

$$V_f = |C_{56}/C_{56} + C_I| V_D \tag{1}$$

where $V_f$ is the voltage provided by the voltage divider;
$C_{56}$ is the capacitance of capacitor 56; and
$C_I$ is the interelectrode capacitance 51.

The source signal voltage $(V_S)$ and the drain signal voltage $(V_D)$, within a linear region of operation of FET 10 at the desired frequency, are in accordance with the following voltage relationship:

$$V_D = |g_m Z_{LD}| \cdot V_S \quad (2)$$

where
$g_m$ is the transconductance of FET 10; and
$Z_{LD}$ is an impedance equal to the gate to drain impedance in parallel with the output impedance of FET 10 measured between gate electrode 30 and electrode 42 (drain).

The term, $g_m Z_{LD}$, is usually much greater than unity thereby causing the drain signal voltage ($V_D$) to be larger than the source signal voltage ($V_S$). As known to those skilled in the art, the drain signal voltage ($V_D$) and the source signal voltage ($V_S$) are in phase. Accordingly, a sufficiently large portion of the drain signal voltage ($V_D$) fed back via capacitor 56 to source electrode 36 causes oscillation. The criteria for oscillation is in accordance with a feedback relationship which is given as:

$$V_S \leq V_f \quad (3)$$

Substituting the term $|C_{56}/C_{56}+C_I| V_D$ of the voltage divider relationship (1) for $V_f$ in the simplified feedback relationship (3) results in:

$$V_S \leq |C_{56}/C_{56}+C_I| V_D \quad (4)$$

Substituting the term, $|g_m Z_{LD}| V_S|$, in the voltage relationship (2) for the term, $V_D$, in equation (4) provides a criteria for oscillation which is given as:

$$1 \leq |g_m Z_{LD}| |C_{56}/C_{56}+C_I| \quad (5)$$

It should be understood that at frequencies other than the desired frequency, the reduced gate to drain impedance causes the impedance, $Z_{LD}$, to have a reduced value that causes the term, $|g_m Z_{LD}| |C_{56}/C_{56}+C_I|$, in the criterion for oscillation (5) to be less than unity, thereby preventing oscillation at other frequencies. Thus, there is provided a power oscillator that utilizes a circuit (29) in accordance with the invention.

Circuit 29 may alternatively be included as an element of a reflection amplifier. An essential element of a reflection amplifier is a circuit with a port that has an input impedance with a negative real part. When the input impedance has the negative real part, the port has a reflection coefficient greater than unity whereby a wave reflected from the port has a greater amplitude than an incident wave that causes the reflection.

As will be understood by those skilled in the art, the reflection coefficient of circuit 29 at port 44 (FIG. 2) is in accordance with a relationship which is given in terms of S parameters as:

$$\Gamma_\alpha = S_{11} + (S_{12} S_{21} \Gamma_l / 1 - S_{22} \Gamma_l) \quad (6)$$

where
$\Gamma_\alpha$ is the reflection coefficient at port 44;
$\Gamma_l$ is the reflection coefficient of impedance 48;
$S_{11}$ is the reflection coefficient at port 44 when impedance 48 is non-reflecting.

$S_{12}$ is a reverse ratio of the transmission amplitude of a voltage wave provided to port 44 to a voltage wave propagated from a port connected to impedance 48;
$S_{21}$ is a forward transmission ratio of the amplitude of a voltage wave that propagates towards impedance 48 and a voltage wave that propagates into port 44; and
$S_{22}$ is the reflection coefficient at the output 72, 74 of circuit 29.

See R. W. Anderson "S-Parameter Technique for Faster, More Accurate Network Design", Hewlett-Packart Journal, February, 1967, Vol. 18, No. 6.

In this embodiment, impedance 48 is selected to cause the reflection coefficient at port 44 ($\Gamma_\alpha$) to be greater than unity, the selection being possible because the stability factor (k) of FET 10 is less than unity.

Figure 4:
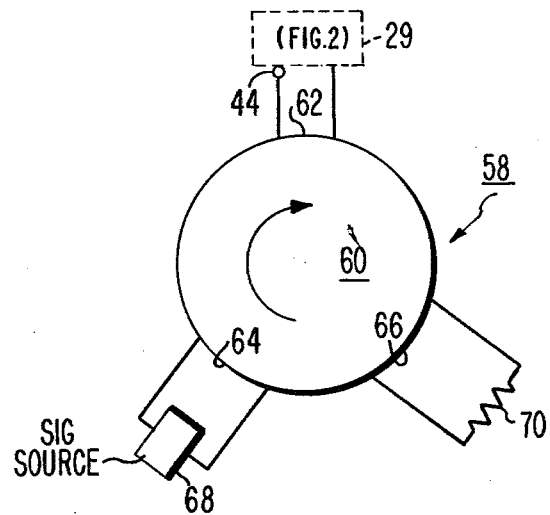
FIG. 4 is a schematic diagram of a reflection amplifier that includes the circuit of FIG. 2.

As shown in FIG. 4, in a reflection amplifier 58, port 44 is coupled to a circulator 60 at a port 62 thereof. Additionally, ports 64 and 66 of circulator 60 are coupled to a signal source 68 and to a load 70, respectively.

An input voltage wave is provided by source 68 to circulator 60. The input voltage wave circulates to port 44 via port 62. Because the reflection coefficient at port 44 is greater than unity, circuit 29 reflects an output voltage wave that has an amplitude greater than the input wave. The output wave circulates through circulator 60 to load 70 via port 66.

Aspects of this disclosure have been published in the Technical Note, "X-Band Reverse Channel GaAs FET Power VCO" by Paul C. Wade, Microwave Journal, Vol. 21, No. 4, April, 1978, page 92.

What is claimed is:

1. A reflection amplifier that includes a three-port circulator with first and second ports thereof adapted for connection to a signal source and a load, respectively, the improvement comprising:
a field effect transistor including pluralities of unit sources, unit drains and unit gates disposed upon a semiconductor substrate;
electrically conductive material plated on each of said unit sources, said plated material on each of said unit sources having a surface with a displacement from said substrate greater than the maximum displacement of said unit gates and said unit drains from said substrate;
a heat sink connecting said surfaces of said plated unit sources to ground;
means for applying a bias voltage to said transistor for causing a higher interelectrode capacitance between said unit gates and said unit drains than between said unit gates and said plated unit sources, said unit gates, unit sources, and unit drains being connected to form a gate electrode, a drain electrode and a source electrode, respectively, of said transistor; and
an impedance connected to said drain and source electrodes so that said transistor causes a reflection coefficient greater than unity at an input port connected to said gate and drains electrodes, said input port being connected to said third port of said circulator.

* * * * *